US011808824B2

(12) United States Patent
Hao et al.

(10) Patent No.: US 11,808,824 B2
(45) Date of Patent: Nov. 7, 2023

(54) SYSTEMS AND METHODS TO IDENTIFY OPEN PHASES OF A CAPACITOR BANK

(71) Applicant: Schweitzer Engineering Laboratories, Inc., Pullman, WA (US)

(72) Inventors: Kei Hao, Anaheim, CA (US); Jeremy William Blair, Jackson, MS (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 381 days.

(21) Appl. No.: 17/204,250

(22) Filed: Mar. 17, 2021

(65) Prior Publication Data

US 2022/0299579 A1    Sep. 22, 2022

(51) Int. Cl.
*G01R 31/64* (2020.01)
*G01R 19/10* (2006.01)
*G01R 25/00* (2006.01)
*G01R 19/165* (2006.01)
*G01R 19/25* (2006.01)

(52) U.S. Cl.
CPC ............ *G01R 31/64* (2020.01); *G01R 19/10* (2013.01); *G01R 19/16571* (2013.01); *G01R 19/2513* (2013.01); *G01R 25/00* (2013.01)

(58) Field of Classification Search
CPC .............. G01R 31/64; G01R 19/16571; G01R 19/2513; G01R 25/00; G01R 19/10
See application file for complete search history.

(56) References Cited

U.S. PATENT DOCUMENTS

| | | | |
|---|---|---|---|
| 3,488,559 | A | 1/1970 | Souillard |
| 3,585,298 | A | 6/1971 | Liberman |
| 3,626,281 | A | 12/1971 | Souillard |
| 3,670,240 | A | 6/1972 | Maranchak |
| 3,878,460 | A | 4/1975 | Nimmersjo |
| 3,890,544 | A | 6/1975 | Chamia |
| 3,956,671 | A | 5/1976 | Nimmersjo |
| 4,053,816 | A | 10/1977 | Nimmersjo |
| 4,254,444 | A | 3/1981 | Eriksson |
| 4,296,452 | A | 10/1981 | Eriksson |
| 4,344,142 | A | 8/1982 | Diehr |

(Continued)

OTHER PUBLICATIONS

SEL-734B Capacitor Bank Control Field Reference Guide, Schweitzer Engineering Laboratories Inc., Dec. 2018.

*Primary Examiner* — Jeff W Natalini
(74) *Attorney, Agent, or Firm* — Fletcher Yoder, LLC

(57) ABSTRACT

Methods and devices are provided for determining the number of open phases and which particular phases may be open in capacitor bank system. Detecting open phases may include determining a neutral current of the capacitor bank system. According to one detection method, in response to a magnitude of the neutral current being greater than a threshold value, an IED may calculate an aggregate power phasor for the phases of the capacitor bank system with respect to each rotation. According to another detection method, in response to the magnitude of the neutral current being greater than a threshold value, an IED may calculate an individual power phasor for each of the phases of the capacitor bank system with respect to each rotation. Based on the magnitude and angles of the power phases, the IED may determine the presence of open phases and which particular phases may be open, respectively.

24 Claims, 8 Drawing Sheets

(56) References Cited

U.S. PATENT DOCUMENTS

| | | |
|---|---|---|
| 4,351,011 A | 9/1982 | Liberman |
| 4,377,834 A | 3/1983 | Eriksson |
| 4,499,417 A | 2/1985 | Wright |
| 4,513,340 A | 4/1985 | Drain |
| 4,626,772 A | 12/1986 | Michel |
| 4,670,811 A | 6/1987 | Eda |
| 4,704,653 A | 11/1987 | Li |
| 4,766,549 A | 8/1988 | Schweitzer |
| 4,795,983 A | 1/1989 | Crockett |
| 4,797,805 A | 1/1989 | Nimmersjö |
| 4,800,509 A | 1/1989 | Nimmersjö |
| 5,140,492 A | 8/1992 | Schweitzer |
| 5,198,746 A | 3/1993 | Gyugyi |
| 5,208,545 A | 5/1993 | Schweitzer |
| 5,390,067 A | 2/1995 | Eriksson |
| 5,446,387 A | 8/1995 | Eriksson |
| 5,455,776 A | 10/1995 | Novosel |
| 5,515,227 A | 5/1996 | Roberts |
| 5,572,138 A | 11/1996 | Nimmersjö |
| 5,682,100 A | 10/1997 | Rossi |
| 5,729,144 A | 3/1998 | Cummins |
| 5,793,750 A | 8/1998 | Schweitzer |
| 5,796,258 A | 8/1998 | Yang |
| 6,008,971 A | 12/1999 | Duba |
| 6,256,592 B1 | 7/2001 | Roberts |
| 6,341,055 B1 | 1/2002 | Guzman-Casillas |
| 6,417,791 B1 | 7/2002 | Benmouyal |
| 6,477,475 B1 | 11/2002 | Takaoka |
| 6,496,342 B1 | 12/2002 | Horvath |
| 6,518,767 B1 | 2/2003 | Roberts |
| 6,525,543 B1 | 2/2003 | Roberts |
| 6,590,397 B2 | 7/2003 | Roberts |
| 6,597,180 B1 | 7/2003 | Takaoka |
| 6,608,742 B2 | 8/2003 | Schweitzer |
| 6,650,969 B1 | 11/2003 | Sieleman |
| 6,697,240 B2 | 2/2004 | Nelson |
| 6,738,719 B2 | 5/2004 | Stoupis |
| 6,760,670 B2 | 7/2004 | Stoupis |
| 6,798,211 B1 | 9/2004 | Rockwell |
| 6,839,210 B2 | 1/2005 | Roberts |
| 6,904,549 B2 | 6/2005 | Jurisch |
| 7,174,261 B2 | 2/2007 | Gunn |
| 7,345,488 B2 | 3/2008 | Fischer |
| 7,355,412 B1 | 4/2008 | Cannon |
| 7,400,150 B2 | 7/2008 | Cannon |
| 7,425,778 B2 | 9/2008 | Labuschagne |
| 7,535,233 B2 | 5/2009 | Kojovic |
| 7,660,088 B2 | 2/2010 | Mooney |
| 7,714,735 B2 | 5/2010 | Rockwell |
| 7,733,094 B2 | 6/2010 | Bright |
| 8,081,002 B2 | 12/2011 | Wahlroos |
| 8,183,871 B2 | 5/2012 | Saha |
| 8,315,827 B2 | 11/2012 | Faybisovich |
| 8,525,522 B2 | 9/2013 | Gong |
| 8,558,551 B2 | 10/2013 | Mynam |
| 8,598,887 B2 | 12/2013 | Bjorklund |
| 8,655,609 B2 | 2/2014 | Schweitzer |
| 8,781,766 B2 | 7/2014 | Schweitzer |
| 8,791,704 B2 | 7/2014 | Mynam |
| 8,990,036 B1 | 3/2015 | Schweitzer |
| 9,470,748 B2 | 10/2016 | Schweitzer |
| 9,594,112 B2 | 3/2017 | Schweitzer |
| 9,627,881 B2 | 4/2017 | Schweitzer |
| 10,122,162 B2 | 11/2018 | Yalla |
| 11,592,498 B2 | 2/2023 | Hawaz |
| 2001/0012984 A1 | 8/2001 | Adamiak |
| 2002/0165462 A1 | 11/2002 | Westbrook |
| 2003/0105608 A1* | 6/2003 | Hart ............... H02H 1/0061 702/122 |
| 2004/0189317 A1 | 9/2004 | Borchert |
| 2004/0230387 A1 | 11/2004 | Bechhoefer |
| 2005/0151659 A1 | 7/2005 | Donovan |
| 2006/0012374 A1 | 1/2006 | Kojovic |
| 2008/0077336 A1 | 3/2008 | Fernandes |
| 2009/0230974 A1 | 9/2009 | Kojovic |
| 2011/0058285 A1 | 3/2011 | Wibben |
| 2011/0173496 A1 | 7/2011 | Hosek |
| 2011/0264388 A1 | 10/2011 | Gong |
| 2012/0086459 A1 | 4/2012 | Kim |
| 2013/0021039 A1 | 1/2013 | Bjorklund |
| 2013/0096854 A1 | 4/2013 | Schweitzer |
| 2013/0100564 A1 | 4/2013 | Zhang |
| 2013/0241622 A1 | 9/2013 | Zerbe |
| 2014/0074414 A1 | 3/2014 | Schweitzer, III |
| 2015/0124358 A1* | 5/2015 | Hulse ............... H02H 7/26 361/47 |
| 2015/0188306 A1 | 7/2015 | Yalla |
| 2016/0077149 A1 | 3/2016 | Schweitzer |
| 2016/0077150 A1 | 3/2016 | Schweitzer |
| 2016/0084893 A1 | 3/2016 | Schweitzer |
| 2017/0012424 A1 | 1/2017 | Schweitzer |
| 2017/0082675 A1 | 3/2017 | Schweitzer |
| 2017/0146613 A1 | 5/2017 | Schweitzer |
| 2017/0356965 A1 | 12/2017 | Guzman-Casillas |
| 2019/0181851 A1* | 6/2019 | Landes ............... H01H 3/54 |
| 2021/0048486 A1* | 2/2021 | Bell ............... G01R 31/085 |

* cited by examiner

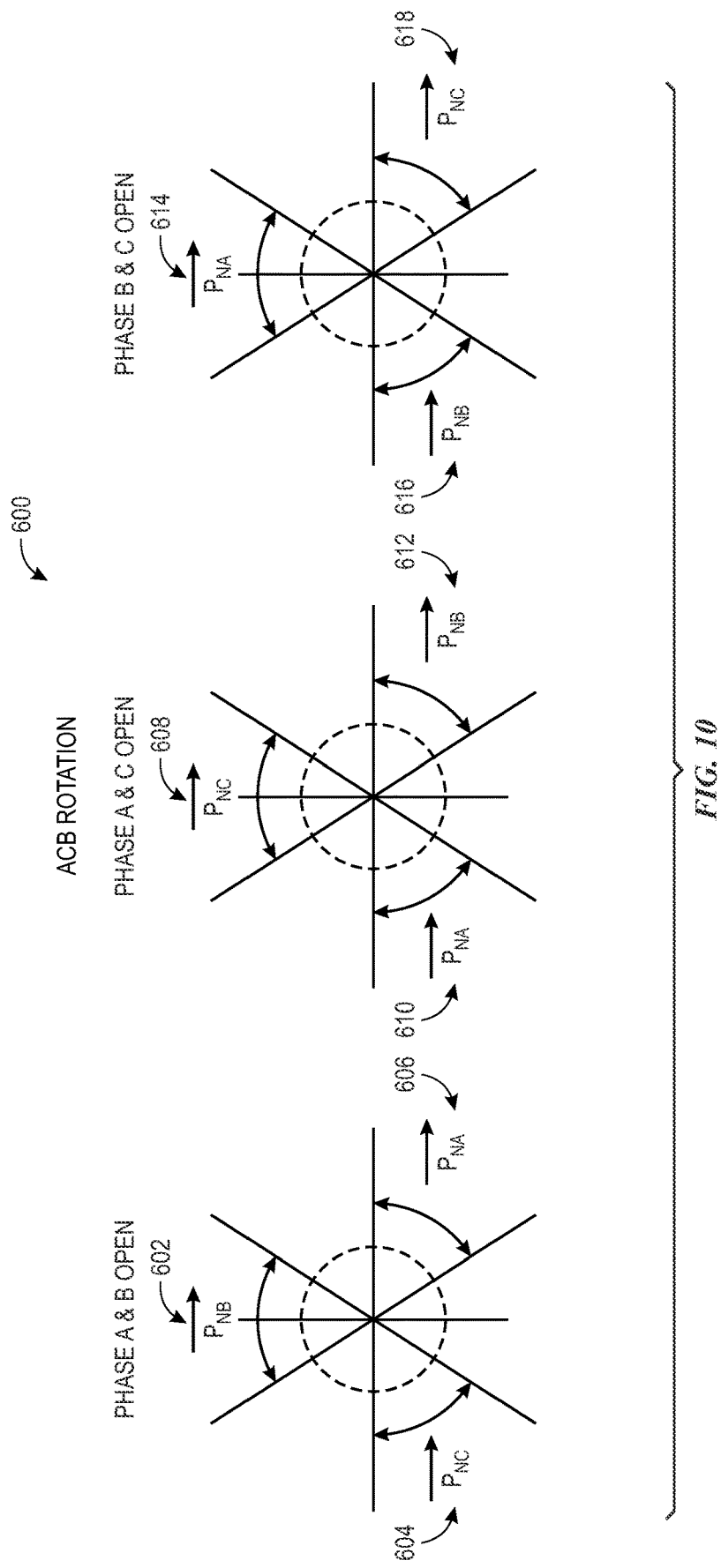

SYSTEMS AND METHODS TO IDENTIFY OPEN PHASES OF A CAPACITOR BANK

BACKGROUND

This disclosure relates to monitoring an electric power distribution system. More particularly, this disclosure relates to determining operating conditions of capacitor bank phases within the electric power distribution system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electric power distribution systems carry electricity from a transmission system to residential communities, factories, industrial areas, and other electricity consumers. Within an electric power distribution system, a capacitor bank may include multiple capacitors and store electrical charge. The capacitors within the capacitor bank may be configured as a multi-phase system (e.g., three-phase system). Capacitor banks help maintain bus voltage and power factor of the electric power distribution system within acceptable limits, and thus reduce electrical transmission line losses. However, blown fuses, switch failures, jumper failures, capacitor failures, and so forth may result in one or more open phases of the capacitor bank, thereby causing operational issues within the electric power distribution system.

SUMMARY

Certain examples commensurate in scope with the originally claimed subject matter are discussed below. These examples are not intended to limit the scope of the disclosure. Indeed, the present disclosure may encompass a variety of forms that may be similar to or different from the examples set forth below.

In one example, a method for determining which phases of a multi-phase capacitor bank system are open is provided. A neutral current of the multi-phase capacitor bank system may be calculated. Based on a magnitude of the neutral current being greater than a first threshold value, a power phasor with respect to an ABC rotation, an ACB rotation, or both of the multi-phase capacitor bank system may be calculated. If a magnitude of the power phasor is greater than a second threshold value, then one or more phases may be open within the multi-phase capacitor bank system. After determining that one or more phases are open, a phase angle of the power phasor may be used to determine which of the one or more phases are open and a notification indicating the one or more phases that are open may be issued.

In another example, tangible, non-transitory, computer-readable media may include instructions that, when executed by a processor of an intelligent electronic device that controls at least part of an electrical distribution system, cause the processor to determine a neutral current of a multi-phase capacitor bank system. In response to a magnitude of the neutral current being greater than a first threshold value, the processor may calculate a power phasor for each phase the multi-phase capacitor bank system with respect to an ABC phase rotation, an ACB phase rotation, or both. The processor may determine that one or more phases are open within the multi-phase capacitor bank system in response to each magnitude of each power phasor being greater than a second threshold value. Further, the processor may determine which of the one or more phases are open based on each phase angle of each power phasor and issue a notification indicating the one or more phases that are open.

In another example, an intelligent electronic device includes processing circuitry, a communication system, and a memory device. The memory device includes instructions that cause the processing circuity to calculate a power phasor for each phase of a multi-phase capacitor bank system with respect to an ABC phase rotation, an ACB phase rotation, or both. In response to each magnitude of each power phasor being greater than a threshold value, the processing circuitry may determine which of the one or more phases are open based on each phase angle of each power phasor and issue a notification indicating the one or more phases that are open.

BRIEF DESCRIPTION OF THE DRAWINGS

FIG. 10 is a schematic diagram of an ACB rotation used to identify two open phases based on each phase angle of the three different power phasors of FIG. 6, in accordance with an embodiment.

DETAILED DESCRIPTION

Figure 1:
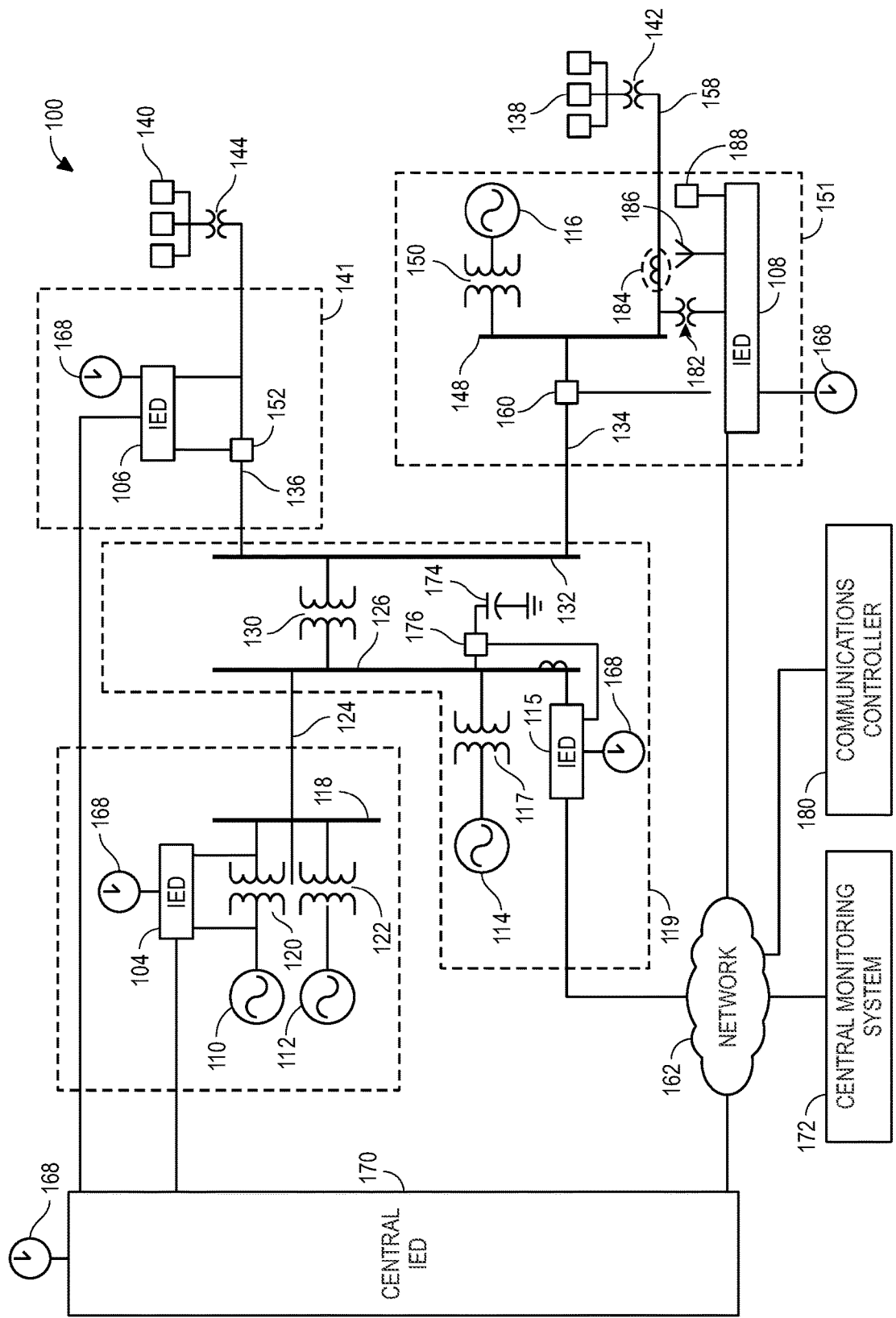
FIG. 1 is a simplified diagram of an electric power distribution system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Moreover, the embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

In addition, several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Thus, embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

Intelligent electronic devices (IEDs) may be used to control certain devices on an electric power distribution system. In examples discussed below, an IED may be a capacitor bank controller that controls a capacitor bank on the electric power distribution system. However, it should be appreciated that the systems and methods of this disclosure may employ any suitable IED to control any suitable device to control an aspect of an electric power distribution system. Thus, where the disclosure below refers to a capacitor bank controller that uses the systems and methods of this disclosure, this should be understood to encompass any other suitable IEDs to control any other suitable devices for an electric power distribution system. Likewise, where the disclosure refers to wireless current sensors (WCSs) that may provide current measurements, this should be understood to encompass any other suitable electrical measurement devices that transmit electrical measurements.

One type of electrical measurement device is a current sensor. A current sensor may be used to reduce higher-voltage currents to lower values, enabling measurements of the electrical current flowing through transmission lines. Current sensors may provide these measurements to IEDs for applications such as protective relaying, electrical load surveying, verification of circuit energization, cost allocation, capacitor bank control, and demand alarming. Some wireless current sensors may operate using energy harvested from a transmission line, allowing them to operate without separate electrical wiring to a power source and/or without a battery or using a relatively smaller battery.

Some IEDs may receive electrical measurements from several wireless electrical measurement devices measuring different respective phases of electric power. For example, three-phase electric power may be transmitted by three respective transmission lines. Three-phase power generally involves three alternating-current (AC) electrical waveforms that are offset from one another in phase by about 120°. The three-phase power waveforms are generally similar to one another, though there may be some variation in magnitude or harmonics from phase to phase. Certain IEDs, such as a capacitor bank controller, may control an electrical component of the power distribution system, such as a capacitor bank, based on the present state of all three phases of power. The capacitor bank may include three different capacitors of three respective phases A, B, and C. Each of the three different capacitors may be coupled to three corresponding switches and fuses.

This disclosure describes systems and methods to identify the operating condition (e.g., open or close) of the three respective phases A, B, and C of the capacitor bank. In general, open phase conditions (e.g., one open phase, two open phases) result in failures within the electric distribution power system such as a capacitor bank system. When the circuit through the capacitor on any phase is closed, electrical current can be expected to flow through the capacitor on that phase. When any component of the circuit through the capacitor is open, there will be no electrical current flowing through the capacitor. Any electrical phase of the capacitor bank system may fail in variety of way such as but not limited to capacitor failures, jumper failures, switch failures, blown fuses, and fuse failures, and thereby resulting in open phase conditions. For example, an open phase condition via a capacitor failure may occur when a capacitor of the capacitor bank has been disconnected from a respective transmission line of the capacitor bank system, experiences mechanical and/or electrical damage, and the like. Further, an open phase condition may occur when a fuse coupled to the capacitor is blown. As used herein, a fuse may be an electrical safety device that removes electrical current from an electrical circuit when the current in the electrical circuit is higher than a threshold current. However, when a fuse is blown, the capacitor becomes an open circuit and electrical current may no longer flow. Additionally, switch failures (e.g., switches that fail to close) may also lead to open phase conditions with the capacitor bank system.

Voltage and current levels that are greater than a maximum operating threshold due to power surges and lightning strikes may lead to blown fuses, damage to capacitors, and/or switch failures, and thereby resulting in open phase conditions within the capacitor bank system. When one or more open phase conditions are present in the capacitor bank system, the capacitor bank system may not be operational. As such, it may be useful to alert maintenance personnel regarding open phases or failures within the capacitor bank system so blown fuses, failed switches, and damaged capacitors may be replaced with functional electrical equipment. In order to detect open phases within the capacitor bank system, a neutral current of the capacitor bank system may be measured. A current sensor such as a neutral current sensor may measure the neutral current of the capacitor bank system. In some embodiments, the neutral current sensor may be coupled to the capacitor bank system via a wire. In other embodiments, the neutral current sensor may be a wireless current sensor (WCS). As used herein, the neutral current is the vector sum of each of the phase currents (e.g., $\vec{I}_{CA}$, $\vec{I}_{CB}$, $\vec{I}_{CC}$) going through the capacitor bank system as later discussed in FIG. 2. If the neural current is not zero, the neutral current may represent the imbalance of phase currents within an unbalanced capacitor bank system. However, if the phase currents are balanced in terms of magnitude and angle within the capacitor bank system, the neutral current may be zero.

The neutral current measurement may be transmitted to an IED (e.g., capacitor bank controller). The IED may determine whether the neutral current is greater than a threshold current. If the neutral current is greater than the threshold current, then the IED may alert maintenance personal regarding open phases within the capacitor bank system. While the IED may be able to determine the presence of open phases within the capacitor bank system based on the neutral current measurement, unfortunately, the IED may not be capable of determining the number of phases that are open and which particular phases are open. Further, the IED or maintenance personnel may inadvertently determine that the presence of open phases may be due to an unbalanced capacitor bank system or high harmonic content (e.g., from inverter-based energy sources) rather than the capacitor bank failures discussed above.

Therefore, identifying the number of open phases and which particular phases may be open within a capacitor bank system may be useful in resolving any failures and maintaining an operational capacitor bank system. Further, a recorded history of when each phase first became open may be useful in updates to electrical system planning models. In one embodiment, after analyzing the neutral current, the IED may calculate a power phasor for a single-phase capacitor bank system or a power phasor for each rotation of a multi-phase capacitor bank system. By way of example, the IED may calculate a fundamental frequency (e.g., 50 Hz, 60 Hz) of the neutral current so that the effect of the harmonic content in the capacitor bank system may be eliminated. The IED may receive the fundamental frequency of the neutral current, which is the sum of the electrical current of each phase (e.g., A, B, C) of the capacitor bank system, from the neutral current sensor. If the magnitude of the neutral current is less than a first threshold, the IED may determine that all three phases are open or closed. If the magnitude of the neutral current is greater than a second threshold current, then the IED may determine the presence of one or two open phases within the capacitor bank system. In turn, to determine the number of open phases and which particular phases may be open, the IED may compute a power phasor for a single-phase voltage installation or for each rotation of a multi-phase voltage installation (e.g., three-phase voltage installation) with respect to the capacitor bank system.

In a capacitor bank installation, voltage measurements may be taken from a single phase or from all three phases. In a single-phase voltage installation, the measured phase may be assumed to be VA, while VB and VC may either be measured as 0V, or may be replicated from VA. When replicated from VA, VB and VC magnitudes are assumed to match that of VA, and their angles are assumed to be at −120 and 120 degrees with respect to VA for an ABC system rotation, or at 120 and −120 degrees with respect to VA for an ACB system rotation. This is known as phantom voltage.

In a single-phase voltage installation, the power phasor ($\vec{P}_{ND}$) may be calculated by taking the product of a voltage ($\vec{V}_1$) at the single phase and the fundamental frequency of the neutral current ($\vec{I}_N$) as shown in the following formulas and assumptions:

$$\vec{P}_{ND} = \vec{V}_1 * \vec{I}_N \quad [1]$$

$$\vec{V}_1 = \vec{V}_A + \vec{a}\,\vec{V}_B + \vec{a}^{\,2}\vec{V}_C \quad [2]$$

$$\vec{a} = 1\angle 120 \quad [3]$$

$$V_1 = V_A; V_B = V_C = 0 \quad [4]$$

By way of example the voltage at the single phase may be the voltage at phase A given that the voltage at phase B and the voltage at phase C are zero or phantom voltages.

In one embodiment with respect to a three-phase voltage installation, the power phasor ($\vec{P}_{ND}$) may be calculated based on summing a vector product of the three voltages (e.g., $\vec{V}_A$, $\vec{V}_B$, $\vec{V}_C$) at each of the three phases A, B, and C and the fundamental frequency of the neutral current (e.g., $|I_N|$) as shown in equations [1] and [2] previously. The neutral current (e.g., $|\vec{I}_N|$) for the three-phase installation is based on the sum of the electrical current at each of the three phases (e.g., $\vec{I}_{CA}$, $\vec{I}_{CB}$, $\vec{I}_{CC}$). Rotations of the three-phase voltage installation may include an ABC rotation or an ACB rotation. In some embodiments, a voltage installation may include any suitable number of phases and may be associated with more phase rotations than the ABC and ACB rotations or fewer phase rotations than the ABC or ACB rotations. After calculating the power phasor for each rotation, the IED may determine whether the magnitude of the power phasor is greater than a threshold value. If the magnitude of the power phasor is greater than the threshold value, the IED may determine the presence of open phases in the capacitor bank system. With respect to each rotation, the IED may determine the number of open phases and which particular phases may be open based on the angle of the power phasor.

In another embodiment, with respect to a three-phase voltage installation, the IED may calculate three different power phasors (e.g., $\vec{P}_{NA}$, $\vec{P}_{NB}$, $\vec{P}_{NC}$) corresponding to the respective phases A,B, and C at each rotation (e.g., ABC rotation, ACB rotation). The power phasor at a single phase (e.g., phase A) is the vector product of the voltage (e.g., $V_A$) at the single phase and the fundamental frequency of the neutral current (e.g, $\vec{I}_N$). After calculating the three different power phasors for each rotation, the IED may determine whether each of the magnitude of the three power phasor is greater than another threshold value. If the magnitudes of each of the three power phasors is greater than the other threshold value, then the IED may determine the presence of open phases in the capacitor bank system. With respect to each rotation, the IED may determine the number of open phases and which particular phases may be open based on the angle of each of the three power phasors. It can be appreciated that a range of specific angles may be identified to determine the number of open phases and which particular phases may be open. In additional and/or alternative embodiments, differences between angle ranges may be used to determine the number of open phases and which particular phases may be open.

FIG. 1 illustrates a simplified diagram of an electric power distribution system 100 (e.g., capacitor bank system) that may use changes in wireless communication rates to determine whether to operate an IED using measurements from a wireless electrical measurement device. The electric power distribution system 100 may generate, transmit, and/or distribute electric energy to loads. As illustrated, the electric power distribution system 100 includes electric generators 110, 112, 114, and 116. The electric power distribution system 100 may also include power transformers 117, 120, 122, 130, 142, 144, and 150. Furthermore, the electric power delivery system may include lines 124, 134, 136, and 158 to transmit and/or deliver power, circuit breakers 152, 160, and 176 to control flow of power in the electric power distribution system 100, busses 118, 126, 132, and 148, and/or loads 138 and 140 to receive the power in and/or from the electric power distribution system 100. A variety of other types of equipment may also be included in electric power distribution system 100, such as current sensors (e.g., wireless current sensor (WCS) 184), potential transformers (e.g., potential transformer 182), voltage regulators, capacitors (e.g., capacitor 174) and/or capacitor banks (e.g., capacitor bank (CB) 188), antennas (e.g., antenna 186), and suitable other types of equipment useful in power generation, transmission, and/or distribution.

A substation 119 may include the electric generator 114, which may be a distributed generator, and which may be connected to the bus 126 through the power transformer 117 (e.g., step-up transformer). The bus 126 may be connected to a distribution bus 132 via the power transformer 130 (e.g., step-down transformer). Various distribution lines 136 and 134 may be connected to the distribution bus 132. The distribution line 136 may lead to a substation 141 where the distribution line 136 is monitored and/or controlled using an IED 106, which may selectively open and close circuit breaker 152. A load 140 may be fed from distribution line 136. The power transformer 144 (e.g., step-down transformer), in communication with the distribution bus 132 via distribution line 136, may be used to step down a voltage for consumption by the load 140.

A distribution line 134 may deliver electric power to a bus 148 of the substation 151. The bus 148 may also receive electric power from a distributed generator 116 via transformer 150. The distribution line 158 may deliver electric power from the bus 148 to a load 138, and may include the power transformer 142 (e.g., step-down transformer). A circuit breaker 160 may be used to selectively connect the bus 148 to the distribution line 134. The IED 108 may be used to monitor and/or control the circuit breaker 160 as well as the distribution line 158.

The electric power distribution system 100 may be monitored, controlled, automated, and/or protected using IEDs such as the IEDs 104, 106, 108, 115, and 170, and an industrial control system 172. In general, the IEDs in an electric power generation and transmission system may be used for protection, control, automation, and/or monitoring of equipment in the system. For example, the IEDs may be used to monitor equipment of many types, including electric transmission lines, electric distribution lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

As used herein, an IED (e.g., the IEDs 104, 106, 108, 115, and 170) may refer to any processing-based device that monitors, controls, automates, and/or protects monitored equipment within the electric power distribution system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system including multiple IEDs. Moreover, an IED of this disclosure may use a non-transitory computer-readable medium (e.g., memory) that may store instructions that, when executed by a processor of the IED, cause the processor to perform processes or methods disclosed herein. Moreover, the IED may include a wireless communication system to receive and/or transmit wireless messages from a wireless electrical measurement device. The wireless communication system of the IED may be able to communicate with a wireless communication system of the wireless electrical measurement devices, and may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, universal mobile telecommunication system (UMTS), long term evolution (LTE), long term evolution license assisted access (LTE-LAA), fifth-generation (5G) cellular, and/or 5G New Radio (5G NR) cellular).

A common time signal may be distributed throughout the electric power distribution system 100. Utilizing a common time source may ensure that IEDs have a synchronized time signal that can be used to generate time synchronized data, such as synchrophasors. In various embodiments, the IEDs 104, 106, 108, 115, and 170 may receive a common time signal 168. The time signal may be distributed in the electric power distribution system 100 using a communications network 162 and/or using a common time source, such as a Global Navigation Satellite System ("GNSS"), or the like.

According to various embodiments, the industrial control system 172 may include one or more of a variety of types of systems. For example, the industrial control system 172 may include a supervisory control and data acquisition (SCADA) system and/or a wide area control and situational awareness (WACSA) system. A central IED 170 may be in communication with IEDs 104, 106, 108, and 115 IEDs 104, 106, 108 and 115 may be remote from the central IED 170, and may communicate over various media such as a direct communication from IED 106 or over a communications network 162. According to various embodiments, some IEDs may be in direct communication with other IEDs. For example, the IED 104 may be in direct communication with the central IED 170. Additionally or alternatively, some IEDs may be in communication via the communications network 162. For example, the IED 108 may be in communication with the central IED 170 via the communications network 162.

Communication via the communications network 162 may be facilitated by networking devices including, but not limited to, multiplexers, routers, hubs, gateways, firewalls, and/or switches. In some embodiments, the IEDs and the network devices may include physically distinct devices. In certain embodiments, the IEDs and/or the network devices may be composite devices that may be configured in a variety of ways to perform overlapping functions. The IEDs and the network devices may include multi-function hardware (e.g., processors, computer-readable storage media, communications interfaces, etc.) that may be utilized to perform a variety of tasks that pertain to network communications and/or to operation of equipment within the electric power distribution system 100.

A communications controller 180 may interface with equipment in the communications network 162 to create a software-defined network (SDN) that facilitates communication between the IEDs 170, 115, and, 108 and the industrial control system 172. In various embodiments, the communications controller 180 may interface with a control plane (not shown) in the communications network 162. Using the control plane, the communications controller 180 may direct the flow of data within the communications network 162.

The communications controller 180 may receive information from multiple devices in the communications network 162 regarding transmission of data. In embodiments in which the communications network 162 includes fiber optic communication links, the data collected by the communications controller 180 may include reflection characteristics, attenuation characteristics, signal-to-noise ratio characteristics, harmonic characteristics, packet loss statics, and the like. In embodiments in which the communications network 162 includes electrical communication links, the data collected by the communications controller 180 may include voltage measurements, signal-to-noise ratio characteristics, packet loss statics, and the like. In some embodiments, the communications network 162 may include both electrical and optical transmission media. The information collected by the communications controller 180 may be used to assess a likelihood of a failure, to generate information about precursors to a failure, and to identify a root cause of a failure. The communications controller 180 may associate information regarding a status of various communication devices and communication links to assess a likelihood of a failure. Such associations may be utilized to generate information about the precursors to a failure and/or to identify root cause(s) of a failure consistent with embodiments of the present disclosure.

Some IEDs, such as the IED 108, may receive wireless messages from a wireless electrical measurement device, such as the wireless current sensor (WCS) 184. A wireless electrical measurement device such as the wireless current sensor (WCS) 184 may include a processor and non-transitory computer-readable media that may store instructions that, when executed by the processor, cause the processor to obtain the electrical measurements and transmit them wirelessly to an IED, such as the IED 108. To that end, the wireless current sensor (WCS) 184 may include a current transformer, a metering circuit, and a communication system to wireless transmit measurements. The current transformer of the wireless current sensor (WCS) 184 may include a coil that may be looped around one phase of a distribution line (such as the distribution line 158). The electrical current measurement of distribution line 158 may be obtained by measuring the electrical current induced in the coil of the current transformer using the metering circuitry; the induced current is proportional to the current flowing through the measured phase of the distribution line 158. In this way, the wireless current sensor (WCS) 184 may measure an electrical current of an electrical waveform carried by the distribution line 158. For example, the wireless current sensor (WCS) 184 may measure a current magnitude and a zero crossing of an alternating current (AC) electrical waveform on the distribution line 158. In some cases, there may be as many wireless current sensors (WCSs) 184 as there are phases of electrical power on the distribution line 158.

The wireless current sensor (WCS) 184 may send the electrical measurements as wireless messages to the IED 108 via an antenna 186. The IED 108 may also use a time signal 168 to help the IED 108 assess arrival times of the wireless messages received by the IED 108 from the wireless current sensor (WCS) 184. The wireless messages may take any suitable form and may be transmitted using any suitable protocol. To conserve bandwidth, in some embodiments, the wireless messages may contain a representation of the current magnitude measurement and may be sent at a particular time based on a time of a zero crossing measurement. In one example, the wireless current sensor (WCS) 184 may transmit a wireless message immediately upon a zero crossing, so that the IED 108 may identify the zero crossing based on the arrival time of the wireless message. In another example, the wireless current sensor (WCS) 184 may transmit a wireless message just prior to a zero crossing, so that the arrival time of the wireless message at the IED 108—taking into account latencies of message transmission and receipt—is expected to represent the present zero crossing of the electrical current carried on the distribution line 158.

In some embodiments, the IED 108 may operate as a capacitor bank controller (CBC) that may control a capacitor bank (CB) 188. The capacitor bank (CB) 188 may represent an electrical component of the power distribution system 100 that contains capacitors that can be selectively switched to connect to the distribution line 158. Because the capacitors of the capacitor bank (CB) 188 introduce a reactive load to the distribution line 158 when connected to the distribution line 158, the IED 108 may control the switching of the capacitors of the capacitor bank (CB) 188 to control, for example, a power factor and/or phase shift on the distribution line 158. In addition to current measurements from the wireless current sensor (WCS) 184, the IED 108 may also receive voltage measurements from a potential transformer 182.

Figure 2:
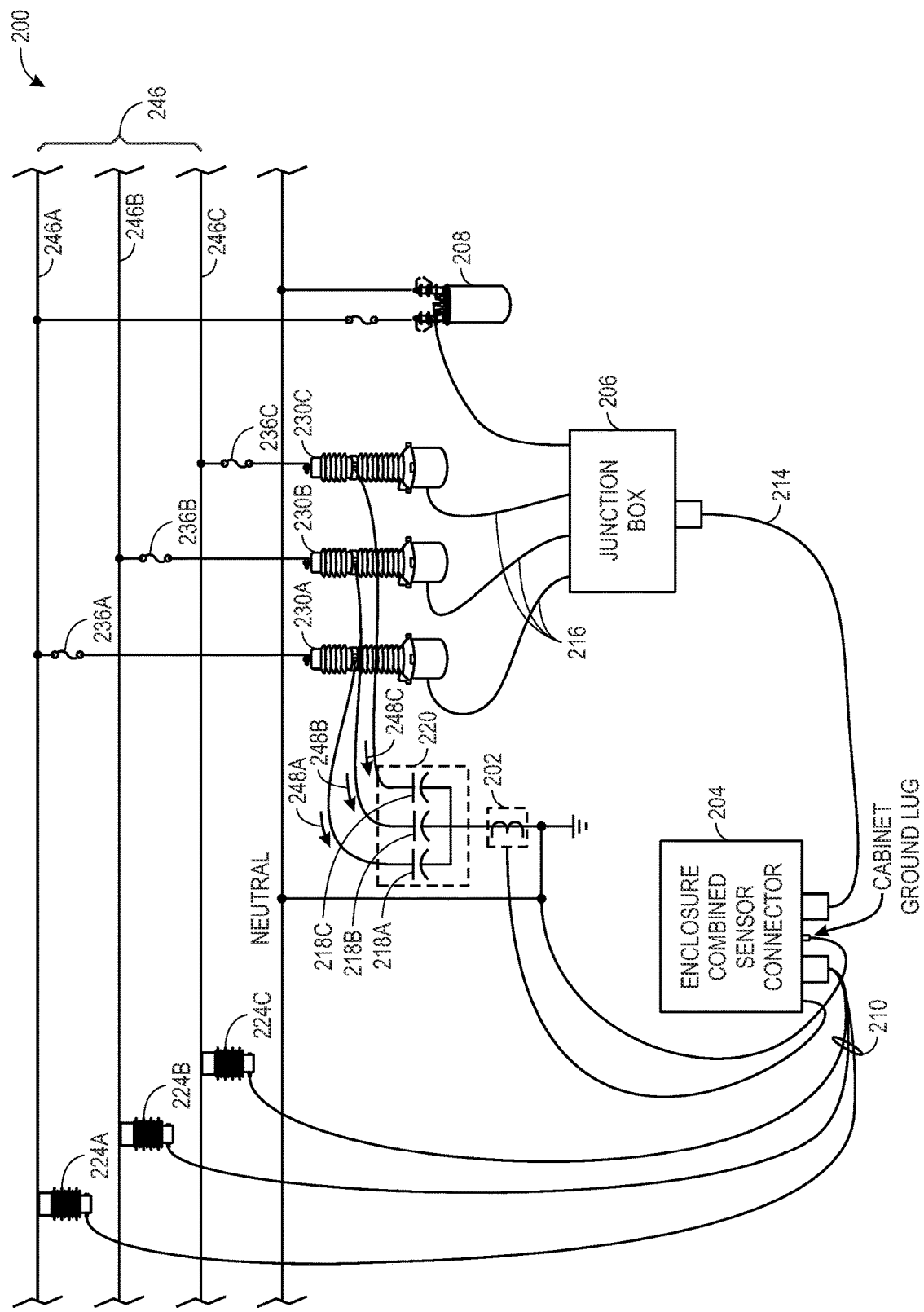
FIG. 2 is a block diagram of a three-phase capacitor bank system of the electric power distribution system of FIG. 1, in accordance with an embodiment.

FIG. 2 is an example three-phase voltage installation 200 with respect to the capacitor bank system 220 may include three capacitors 218A, 218B, and 218C that correspond to three respective phases A, B, and C. The three capacitors 218A, 218B, and 218C may be coupled to three respective switches 230A, 230B, and 230C. Further, the three respective phases may be coupled to three respective fuses 236A, 236B, and 236C. In some embodiments, there may be as many combo sensors as there are phases of electrical power on the distribution line 246. For example, as shown by a three-phase arrangement in FIG. 2, there may be three combo sensors 224A, 224B, and 224C that measure voltage on three respective phases A, B, and C carried by different conductors of the distribution line 246 (246A, 246B, and 246C). Current 248A, 248B, 248C (e.g., $\vec{I}_{CA}$, $\vec{I}_{CB}$, $\vec{I}_{CC}$) may be transmitted respectively across the distribution line 246 (246A, 246B, and 246C). In some embodiments, the three combo sensor 224A, 224B, and 224C may be three corresponding potential transformers that obtain voltage measurements for the three respective phases A, B, and C.

The three-phase voltage installation 200 with respect to the capacitor bank system 220 may also include a neutral current sensor 202 that may measure the neutral current by measuring the electrical current on the three respective phases A, B, and C. A control power transformer 208 may supply voltage to the IED from either of the three respective phases A, B, and C and may be coupled to a junction box 206. The junction box 206 may be a box containing a junction of electric wires or cables. Further, the junction box 206 may be coupled to the control power transformer 208, three switch cables 216, and a junction box control cable 214. The three switch cables 216 may couple to the three respective switches 230A, 230B, and 230C. The junction box control cable 214 may be connected to a combined sensor connector 204. The combined sensor connector 204 may have attributes of an intelligent electronic device (IED) or a capacitor bank controller (CBC) as described in FIG. 1. Further, the combined sensor connector 204 may serve to connect to three sensor cables 210 and cables connecting to the neutral sensor 202. The three sensor cables 210 may couple to the three respective combo sensors 224A, 224B, and 224C.

As mentioned above, failures within the three capacitors 218A, 218B, and 218C, three respective switches 230A, 230B, and the three respective fuses 236A, 236B, and 236C, may lead to open phase conditions within the three-phase voltage installation 200 with respect to the capacitor bank system 220. As such, different IED modes or operations (e.g., detection methods) may be effective to determine the number of open phases or failures and which particular phase is open or has failed. In general, a detection method may involve calculating the fundamental frequency of the neutral current based on the electrical current at the three respective phases A, B, and C. After determining the neutral current is greater than a threshold current value, a power phasor for each rotation of the three-phase arrangement may be calculated. The IED may use the magnitude and angle of the power phasor to determine the presence of open phases, the number of open phases, and which particular phases may be open. Detection methods may vary in how the power phasor is computed for each rotation. The two different detection methods will be discussed in greater detail below.

Figure 3:
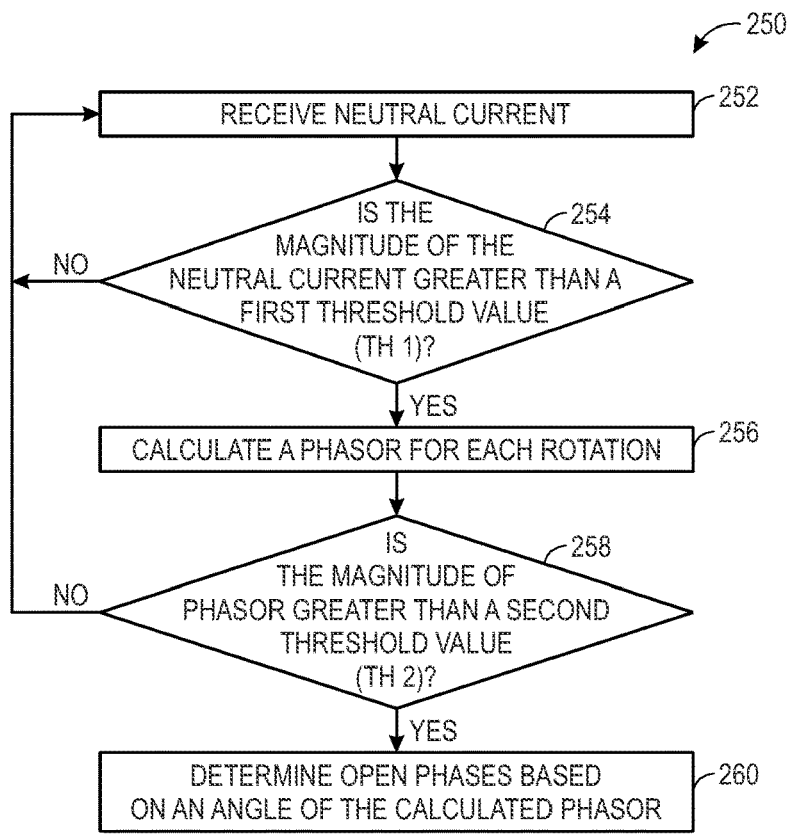
FIG. 3 is a flowchart of a process used to determine open phases of the three-phase capacitor bank system of FIG. 2 by computing a single phasor based on voltages of the three phases, in accordance with an embodiment.

As such, FIG. 3 is a flowchart of a process 250 by which particular detection method identifies open phases by calculating a single phasor for each rotation of a three-phase voltage installation. With respect to this particular detection method, an IED (e.g., capacitor bank controller) may receive a neutral current measurement from a neutral current sensor (block 252). As described above, the neutral current is the sum of the electrical current of the three respective phases A, B, and C of the capacitor bank system. After receiving the neutral current, the IED may determine whether the magnitude of the neutral current (e.g., $|\vec{I}_N|$) is greater than a first threshold value (e.g., Th1) (block 254). If the magnitude of the calculated neutral current is less than the first threshold value, then the IED may determine that each phase of the capacitor bank system is closed. However, if the magnitude of the calculated neutral current is greater than the first threshold value, then the IED may determine the presence of open phases within the capacitor bank system. In turn, to determine the number of open phases and which particular phases may be open, the IED may compute a power phasor for each rotation of the three-phase voltage installation with respect to the capacitor bank system (block 256).

The IED may use the three voltages (e.g., $\vec{V}_A$, $\vec{V}_B$, $\vec{V}_C$) obtained at the respective phases A, B, and C as well as the electrical current (e.g., $\vec{I}_{CA}$, $\vec{I}_{CB}$, $\vec{I}_{CC}$) based on the fundamental frequency of the neutral current at the respective phases A, B, and C to calculate the power phasor (e.g., $\vec{P}_{ND}$) at each rotation. The power phasor at a single phase is the vector product of the voltage at the single phase and the fundamental frequency of the neutral current. In accordance with the detection method of FIG. 3, the power phasor at each rotation may be calculated based on summing the vector product of the voltage at each phase A, B, and C of the three-phase voltage installation and the neutral current. Rotations of the three-phase voltage installation may include an ABC rotation and an ACB rotation. The following power phasor formulas may be used to calculate the power phasor for each rotation:

For *ABC* rotation:

$$\overrightarrow{P_{ND}} =$$

$$\overrightarrow{V_1} * \overrightarrow{I_N} = V_A I_{CA} \langle 90 + V_A I_{CB} \langle -30 + V_A I_{CC} \langle -150 + V_B I_{CA} \langle 90 +$$

$$V_B I_{CB} \langle -30 + V_B I_{CC} \langle -150 + V_C I_{CA} \langle 90 + V_C I_{CB} \langle -30 + V_C I_{CC} \langle -150$$

For *ACB* rotation $$\overrightarrow{P_{ND}} =$$

$$\overrightarrow{V_1} * \overrightarrow{I_N} = V_A I_{CA} \langle 90 + V_A I_{CB} \langle -150 + V_A I_{CB} \langle -300 + V_B I_{CA} \langle 90 +$$

$$V_B I_{CB} \langle -150 + V_B I_{CC} \langle -30 + V_C I_{CA} \langle 90 + V_C I_{CB} \langle -150 + V_C I_{CC} \langle -30$$

As mentioned above, the three-phase arrangement generally involves three alternating-current (AC) electrical waveforms that are offset from one another in phase by about 120°. As such, voltage and neutral current measurements at the three phases going through the capacitor bank A, B, and C may correspond to the three angles 90°, −150°, and −30° depending on an ABC or ACB rotation. After calculating the power phasor for each rotation, the IED may determine whether the magnitude of the power phasor is greater than a second threshold value (Th2) (block 258). If the magnitudes of the power phasor is less than the second threshold value, then the IED may determine that each phase of the capacitor bank system may be closed even though the neutral current may have been greater than the first threshold value. In other embodiments, the IED may notify maintenance personnel regarding the magnitudes the power phasor being less than the second threshold value despite the neutral current being greater than the first threshold value. The maintenance personnel may conduct further testing and/or analyze data received from the IED to verify whether each phase of the capacitor bank system is closed.

However, if the magnitude of the power phasor is greater than the second threshold value, the IED may determine the presence of open phases in the capacitor bank system. As discussed in the following figures, the IED may determine the number of open phases and which particular phases may be open based on the angle of the power phasor (block 260).

Further, the first threshold value and the second threshold value may configurable. The first threshold value and the second threshold value may be empirical values set by the IED or manufacturer of the capacitor bank system 220. The first threshold value and the second threshold value may be modified based on observing patterns and changes in values related to voltage and electrical current measurement for each phase, magnitude and angle corresponding to the power phasor of each rotation, and the like over time. In some embodiments, the first threshold value and the second threshold value may be based on a nominal voltage and expected capacitor bank size of a capacitor bank system. After determining which particular phases may be open, the IED may transmit a notification in real-time to computing device(s) monitored by maintenance personnel or manufacturers of the capacitor bank system regarding the open phases, such that the capacitor bank failures associated with the open phases may be addressed.

Figure 4:
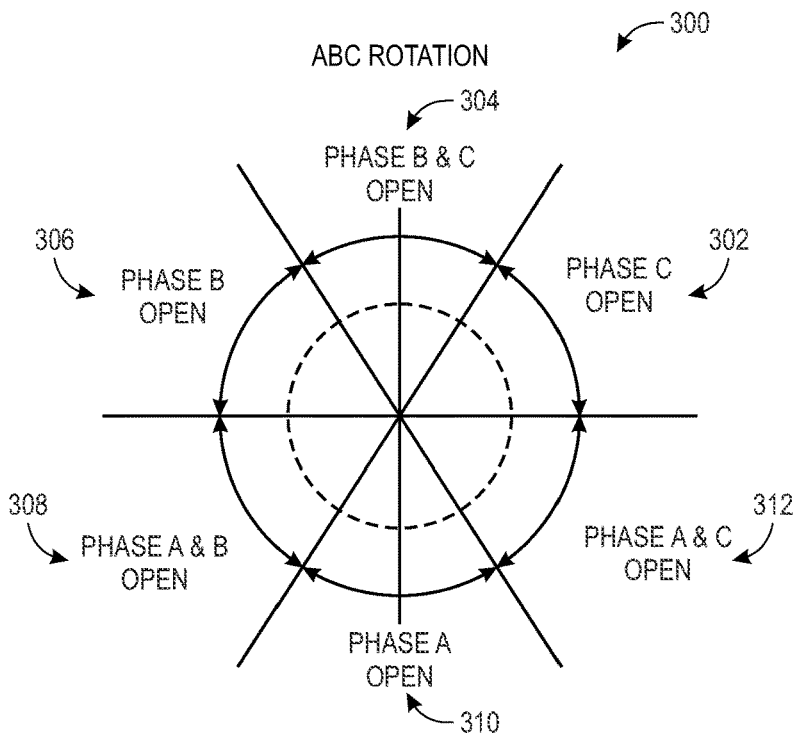
FIG. 4 is a schematic diagram of an ABC rotation used to identify open phase(s) based on a phase angle of the single phasor of FIG. 3, in accordance with an embodiment.

FIG. 4 is a schematic diagram representing an ABC rotation 300 of a three-phase arrangement of the capacitor bank system 220. The IED may determine which particular phases may be open based on the angle of the power phasor (e.g., phase angle). According to the schematic diagram of FIG. 4, if the phase angle is between 0° and 60°, then the IED may determine that phase C is open, as indicated by angle range 302. If the phase angle is between 60° and 120°, then the IED may determine that phases B and C is open, as indicated by angle range 304. If the phase angle is between 120° and 180°, then the IED may determine that phase B is open, as indicated by angle range 306. If the phase angle is between 180° and 240°, then the IED may determine that phases A and B are open, as indicated by angle range 308. If the phase angle is between 240° and 300°, then the IED may determine that phase A is open, as indicated by angle range 310. If the phase angle is between 300° and 360°, then the IED may determine that phases A and C are open, as indicated by angle range 312. For example, with respect to the ABC rotation, if the phase angle is −25° or 335°, then the IED may determine that phases A and C are open. In some embodiments, the angle ranges 302, 304, 306, 308, 310, and 312 may be configurable.

Figure 5:
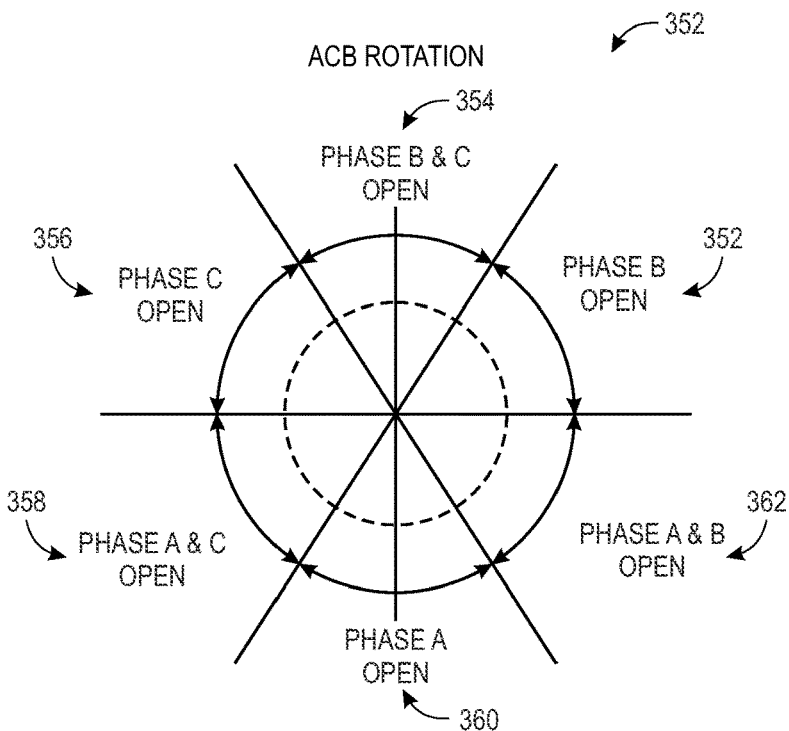
FIG. 5 is a schematic diagram of an ACB rotation used to identify open phase(s) based on a phase angle of the single phasor of FIG. 3, in accordance with an embodiment.

FIG. 5 is a schematic diagram representing an ACB rotation 350 of a three-phase arrangement of the capacitor bank system 220. The IED may determine which particular phases may be open based on the angle of the power phasor (e.g., phase angle). According to the schematic diagram of FIG. 5, if the phase angle is between 0° and 60°, then the IED may determine that phase B is open, as indicated by angle range 352. If the phase angle is between 60° and 120°, then the IED may determine that phases B and C is open, as indicated by angle range 354. If the phase angle is between 120° and 180°, then the IED may determine that phase C is open, as indicated by angle range 356. If the phase angle is between 180° and 240°, then the IED may determine that phases A and C are open, as indicated by angle range 358. If the phase angle is between 240° and 300°, then the IED may determine that phase A is open, as indicated by angle range 360. If the phase angle is between 300° and 360°, then the IED may determine that phases A and B are open, as indicated by angle range 362. For example, with respect to the ABC rotation, if the phase angle is −25° or 335°, then the IED may determine that phases A and B are open. In some embodiments, the angle ranges 352, 354, 356, 358, 360, and 362 may be configurable.

Figure 6:
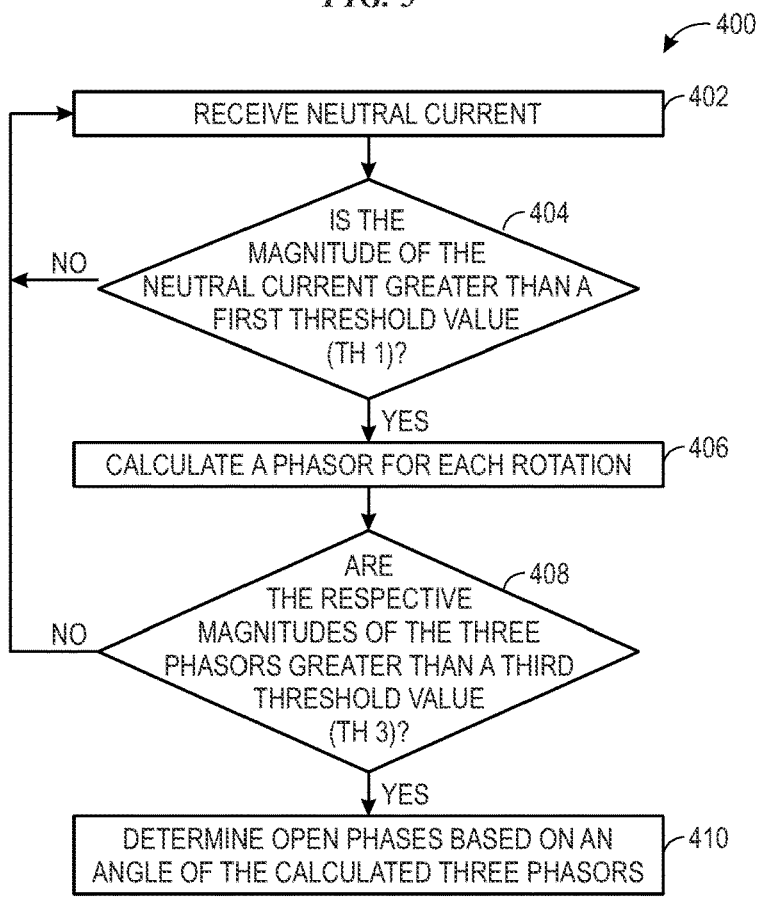
FIG. 6 is a flowchart of another process used to determine open phases of the three-phase capacitor bank system of FIG. 2 by computing three different power phasors for each voltage of the three phases, in accordance with an embodiment.

With the foregoing in mind, FIG. 6 is a flowchart of a process 400 by which another detection method identifies open phases by calculating three power phasors corresponding to the respective phases A, B, and C for each rotation of a three-phase voltage installation. With respect to this particular detection method, an IED (e.g., capacitor bank controller) may receive a neutral current measurement from a neutral current sensor (block 402). As described above, the neutral current is the sum of the electrical current of the three respective phases A, B, and C of the capacitor bank system. After receiving the neutral current, the IED may determine whether the magnitude of the neutral current (e.g., $|\overrightarrow{I_N}|$) greater than a first threshold value (e.g., Th1) (block 404). If the magnitude of the calculated neutral current is less than the first threshold value, then the IED may determine that each phase of the capacitor bank system is closed. However, if the magnitude of the calculated neutral current is greater than the first threshold value, then the IED may determine the presence of open phases within the capacitor bank system. In turn, to determine the number of open phases and which particular phases may be open, the IED may compute three power phasors corresponding to the respective phases A, B, and C for each rotation of the three-phase voltage installation with respect to the capacitor bank system (block 406).

The IED may use each of the three voltages (e.g., $\vec{V}_A$, $\vec{V}_B$, $\vec{V}_C$) obtained at the respective phases A, B, and C as well as each of electrical current (e.g., $\vec{I}_{CA}$, $\vec{I}_{CB}$, $\vec{I}_{CC}$) based on the fundamental frequency of the neutral current at the respective phases A, B, and C to calculate three different power phasors (e.g., $\vec{P}_{NA}$, $\vec{P}_{NB}$, $\vec{P}_{NC}$) corresponding to the respective phases A, B, and C at each rotation. The power phasor at a single phase (e.g., phase A) is the vector product of the voltage (e.g., $V_A$) at the single phase and the fundamental frequency of the neutral current (e.g, $\vec{I}_N$). Rotations of the three-phase voltage installation may include an ABC rotation and an ACB rotation. The following power phasor formulas may be used to calculate the three power phasors for each rotation:

For ABC rotation:

$$\vec{P}_{NA} = \vec{V}_A * \vec{I}_N = V_A I_{CA} \angle 90 + V_A I_{CB} \angle -30 + V_A I_{CC} \angle -150$$

$$\vec{P}_{NB} = \vec{V}_B * \vec{I}_N = V_B I_{CA} \angle -30 + V_B I_{CB} \angle -150 + V_B I_{CC} \angle 90$$

$$\vec{P}_{NC} = \vec{V}_C * \vec{I}_N = V_C I_{CA} \angle -150 + V_C I_{CB} \angle 90 + V_C I_{CC} \angle -30$$

For ACB rotation:

$$\vec{P}_{NA} = \vec{V}_A * \vec{I}_N = V_A I_{XA} \angle 90 + V_A I_{CB} \angle -150 + V_A I_{CC} \angle -30$$

$$\vec{P}_{NB} = \vec{V}_B * \vec{I}_N = V_B I_{CA} \angle -150 + V_B I_{CB} \angle -30 + V_B I_{CC} \angle 90$$

$$\vec{P}_{NC} = \vec{V}_C * \vec{I}_N = V_C I_{CA} \angle -30 + V_C I_{CB} \angle 90 + V_C I_{CC} \angle -150$$

As mentioned above, the three-phase arrangement generally involves three alternating-current (AC) electrical waveforms that are offset from one another in phase by about 120°. As such, voltage and neutral current measurements at the three phases going through the capacitor bank A, B, and C may correspond to the three angles 90°, −150°, and −30° depending on an ABC or ACB rotation. After calculating the three different power phasors for each rotation, the IED may determine whether each of the magnitude of the three power phasor is greater than a third threshold value (Th3) (block 408). If the magnitudes of each of the three power phasors is less than the third threshold value, then the IED may determine that each phase of the capacitor bank system may be closed even though the neutral current may have been greater than the first threshold value. In other embodiments, the IED may notify maintenance personnel regarding the magnitudes of each of the three power phasors being less than the third threshold value despite the neutral current being greater than the first threshold value. The maintenance personnel may conduct further testing and/or analyze data received from the IED to verify whether each phase of the capacitor bank system is closed.

However, if the magnitudes of each of the three power phasors is greater than the third threshold value (e.g., $|\vec{P}_{NA}|$>Th3, $|\vec{P}_{NB}|$>Th3, $|\vec{P}_{NC}|$>Th3), the IED may determine the presence of open phases in the capacitor bank system. As discussed in the following figures, the IED may determine the number of open phases and which particular phases may be open based on the angle of each of the three power phasors (block 410). It should be noted that the third threshold value may be different than the second threshold value of FIG. 3 and the first threshold value of FIGS. 3 and 6. In some embodiments, the third threshold value may be similar in value to the second threshold value of FIG. 3 and the first threshold value of FIGS. 3 and 6.

Similar to the detection method of FIG. 3, the first threshold value and the third threshold value may configurable. That is, the first threshold value and the third threshold value may be empirical values set by the IED or manufacturer of the capacitor bank system 220. The first threshold value and the third threshold value may be modified based on observing patterns and changes in values related to voltage and electrical current measurement for each phase, magnitude and angle corresponding to the power phasor of each rotation, and the like over time. In some embodiments, the first threshold value and the third threshold value may be based on a nominal voltage and expected capacitor bank size of a capacitor bank system. After determining which particular phases may be open, the IED may transmit a notification in real-time to computing device(s) monitored by maintenance personnel or manufacturers of the capacitor bank system regarding the open phases, such that the capacitor bank failures associated with the open phases may be addressed.

Figure 7:
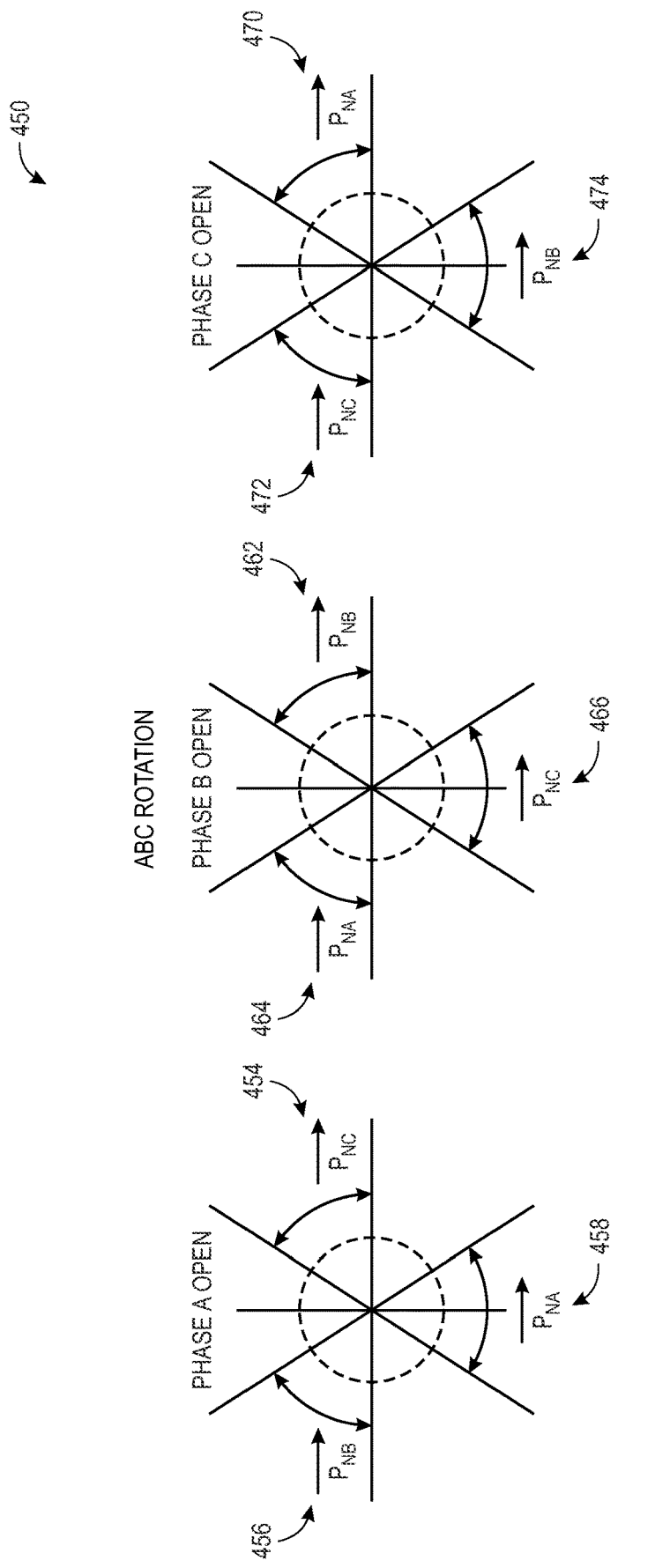
FIG. 7 is a schematic diagram of an ABC rotation used to identify an open phase based on each phase angle of the three different power phasors of FIG. 6, in accordance with an embodiment.

FIG. 7 is a schematic diagram of an ABC rotation 450 used to identify a single open phase based on each phase angle of the three different power phasors calculated in FIG. 6. The IED may determine which particular phase may be open based on the angle of each of the three power phasors (e.g., $\vec{P}_{NA}$, $\vec{P}_{NB}$, $\vec{P}_{NC}$). According to the schematic diagram of FIG. 7, if phase angle C is between 0° and 60° (as indicated by angle range 454), phase angle B is between 120° and 180° (as indicated by angle range 456), phase angle A is between 240° and 300° (as indicated by angle range 458), or any combination thereof, then the IED may determine that phase A is open. The IED may determine that phase B is open if phase angle B is between 0° and 60° (as indicated by angle range 462), phase angle A is between 120° and 180° (as indicated by angle range 464), phase angle C is between 240° and 300° (as indicated by angle range 466), or any combination thereof. Further, the IED may determine that phase C is open if phase angle A is between 0° and 60° (as indicated by angle range 470), phase angle C is between 120° and 180° (as indicated by angle range 472), phase angle B is between 240° and 300° (as indicated by angle range 474), or any combination thereof. For example, with respect to the ABC rotation, if the phase angle A is 30°, phase angle B is 250°, and phase angle C is 160°, then the IED may determine that phase C is open. In some embodiments, the angle ranges 454, 456, 458, 462, 464, 466, 470, 472, and 474 may be configurable.

Figure 8:
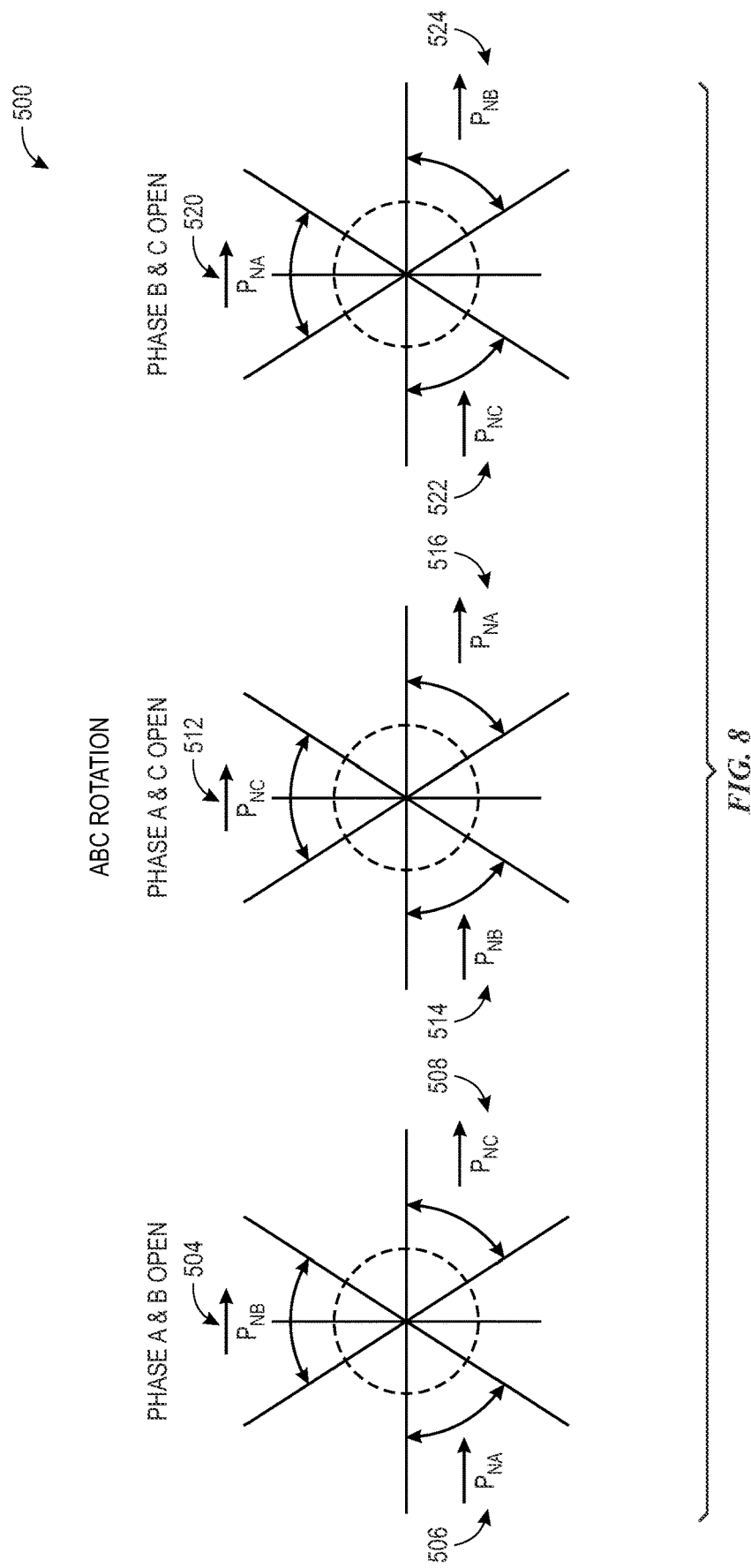
FIG. 8 is a schematic diagram of an ABC rotation used to identify two open phases based on each phase angle of the three different power phasors of FIG. 6, in accordance with an embodiment.

FIG. 8 is another schematic diagram of an ABC rotation 500 used to identify at least two open phases based on each phase angle of the three different power phasors calculated in FIG. 6. The IED may determine which two particular phases may be open based on the angle of each of the three power phasors (e.g., $\vec{P}_{NA}$, $\vec{P}_{NB}$, $\vec{P}_{NC}$). According to the schematic diagram of FIG. 8, if phase angle B is between 60° and 120° (as indicated by angle range 504), phase angle A is between 180° and 240° (as indicated by angle range 506), phase angle C is between 300° and 360° (as indicated by angle range 508), or any combination thereof, then the IED may determine that phases A and B are open. The IED may determine that phases A and C are open if phase angle C is between 60° and 120° (as indicated by angle range 512), phase angle B is between 180° and 240° (as indicated by angle range 514), phase angle A is between 300° and 360° (as indicated by angle range 516), or any combination thereof. Further, the IED may determine that phases B and C are open if phase angle A is between 60° and 120° (as indicated by angle range 520), phase angle C is between 180° and 240° (as indicated by angle range 522), phase angle B is between 300° and 360° (as indicated by angle range 524), or any combination thereof. For example, with respect to the ABC rotation, if the phase angle A is 80°, phase angle B is 320°, and phase angle C is 200°, then the IED may determine that phases B and C are open. In some embodiments, the angle ranges 504, 506, 508, 512, 514, 516, 520, 522, and 524 may be configurable.

Figure 9:
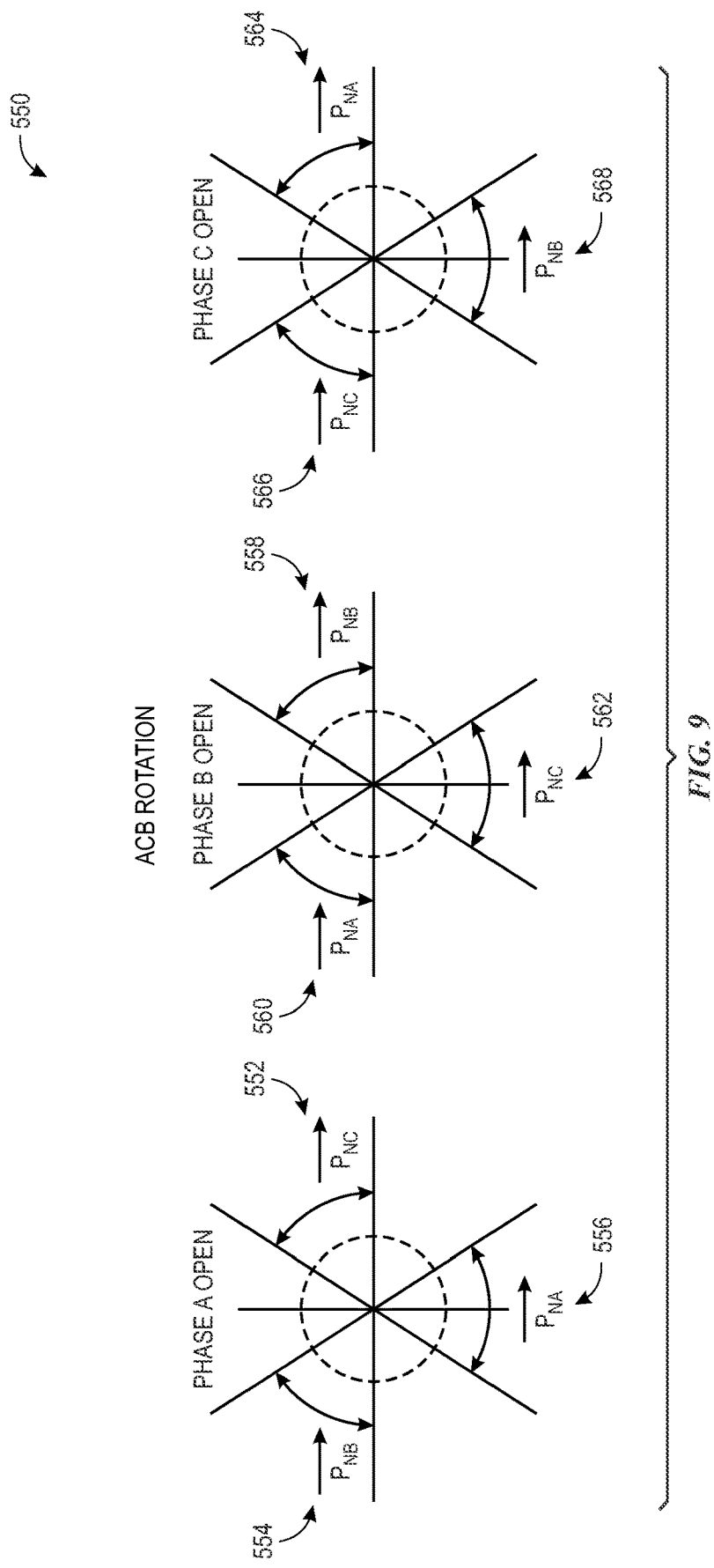
FIG. 9 is a schematic diagram of an ACB rotation used to identify an open phase based on each phase angle of the three different power phasors of FIG. 6, in accordance with an embodiment.

FIG. 9 is a schematic diagram of an ACB rotation 550 used to identify a single open phase based on each phase angle of the three different power phasors calculated in FIG. 6. The IED may determine which particular phase may be open based on the angle of each of the three power phasors (e.g., $\vec{P}_{NA}, \vec{P}_{NB}, \vec{P}_{NC}$) According to the schematic diagram of FIG. 9, if phase angle C is between 0° and 60° (as indicated by angle range 552), phase angle B is between 120° and 180° (as indicated by angle range 554), phase angle A is between 240° and 300° (as indicated by angle range 556), or any combination thereof, then the IED may determine that phase A is open. The IED may determine that phase B is open if phase angle B is between 0° and 60° (as indicated by angle range 558), phase angle A is between 120° and 180° (as indicated by angle range 560), phase angle C is between 240° and 300° (as indicated by angle range 562), or any combination thereof. Further, the IED may determine that phase C is open if phase angle A is between 0° and 60° (as indicated by angle range 564), phase angle C is between 120° and 180° (as indicated by angle range 566), phase angle B is between 240° and 300° (as indicated by angle range 568), or any combination thereof. For example, with respect to the ABC rotation, if the phase angle A is 30°, phase angle B is 250°, and phase angle C is 160°, then the IED may determine that phase C is open. In some embodiments, the angle ranges 552, 554, 556, 558, 560, 562, 564, 566, and 568 may be configurable.

FIG. 10 is another schematic diagram of an ACB rotation 600 used to identify at least two open phases based on each phase angle of the three different phasors calculated in FIG. 6. The IED may determine which two particular phases may be open based on the angle of each of the three power phasors (e.g., $\vec{P}_{NA}, \vec{P}_{NB}, \vec{P}_{NC}$). According to the schematic diagram of FIG. 10, if phase angle B is between 60° and 120° (as indicated by angle range 602), phase angle C is between 180° and 240° (as indicated by angle range 604), phase angle A is between 300° and 360° (as indicated by angle range 606), or any combination thereof, then the IED may determine that phases A and B are open. The IED may determine that phases A and C are open if phase angle C is between 60° and 120° (as indicated by angle range 608), phase angle A is between 180° and 240° (as indicated by angle range 610), phase angle C is between 300° and 360° (as indicated by angle range 612), or any combination thereof. Further, the IED may determine that phases B and C are open if phase angle A is between 60° and 120° (as indicated by angle range 614), phase angle B is between 180° and 240° (as indicated by angle range 616), phase angle C is between 300° and 360° (as indicated by angle range 618), or any combination thereof. For example, with respect to the ABC rotation, if the phase angle A is 80°, phase angle B is 200°, and phase angle C is 320°, then the IED may determine that phases B and C are open. In some embodiments, the angle ranges 602, 604, 606, 608, 610, 612, 614, and 618 may be configurable.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A method, comprising:
    determining a neutral current of a multi-phase capacitor bank system based on a neutral current sensor;
    in response to a magnitude of the neutral current being greater than a first threshold value, calculating a power phasor with respect to an ABC rotation, an ACB rotation, or both of the multi-phase capacitor bank system, wherein the power phasor comprises a vector product of a voltage measured by a respective combo sensor at a phase of one or more phases of the multi-phase capacitor bank system and a fundamental frequency of the neutral current;
    in response to a magnitude of the power phasor being greater than a second threshold value:
        determining, via an intelligent electronic device (IED), that the one or more phases are open within the multi-phase capacitor bank system;
        determining, via the IED, which of the one or more phases are open based on a phase angle of the power phasor; and
        transmitting, via the IED, a notification indicating the one or more phases that are open.

2. The method of claim 1, wherein the first threshold value and the second threshold value are based on a nominal voltage and expected capacitor bank size of the multi-phase capacitor bank system.

3. The method of claim 1, wherein the neutral current is determined based on a summation of electrical current associated with each phase of the multi-phase capacitor bank system.

4. The method of claim 1, comprising determining that a third phase is open with respect to the ABC rotation and determining a second phase is open with respect to the ACB rotation when the phase angle is between 0° and 60°.

5. The method of claim 1, comprising determining that a second phase and a third phase are open when the phase angle is between 60° and 120° with respect to the ABC rotation and the ACB rotation.

6. The method of claim 1, comprising determining that a second phase is open with respect to the ABC rotation and determining that a third phase is open with respect to the ACB rotation when the phase angle is between 120° and 180°.

7. The method of claim 1, comprising determining that a first phase and a second phase are open with respect to the ABC rotation and determining the first phase and a third phase are open with respect to the ACB rotation when the phase angle is between 180° and 240°.

8. The method of claim 1, comprising determining that a first phase is open when the phase angle is between 240° and 300° with respect to the ABC rotation and the ACB rotation.

9. The method of claim 1, comprising determining that a first phase and a third phase are open with respect to the ABC rotation and determining that the first phase and a second phase are open with respect to the ACB rotation when the phase angle is between 300° and 360°.

10. The method of claim 1, wherein the first threshold value, the second threshold value, or both, are based on a nominal voltage and a bank size of the multi-phase capacitor bank.

11. One or more tangible, non-transitory, computer-readable media comprising instructions that, when executed by a processor of an intelligent electronic device configured to control at least part of an electric power distribution system, cause the processor to:
   determine a neutral current of a multi-phase capacitor bank system based on a neutral current sensor;
   in response to a magnitude of the neutral current being greater than a first threshold value, calculate a power phasor for each phase the multi-phase capacitor bank system with respect to an ABC phase rotation, an ACB phase rotation, or both, wherein the power phasor comprises a vector product of a voltage measured by a respective combo sensor at each phase of one or more phases of the multi-phase capacitor bank system and a fundamental frequency of the neutral current;
   in response to each magnitude of each power phasor being greater than a second threshold value, determine that the one or more phases are open within the multi-phase capacitor bank system and therefore:
      determine, via the intelligent electronic device (IED), which of the one or more phases are open based on each phase angle of each power phasor; and
      transmit, via the IED, a notification indicating the one or more phases that are open.

12. The one or more tangible, non-transitory, computer-readable media of claim 11, comprising instructions that, when executed by the processor, cause the processor to determine that a first phase is open with respect to the ABC phase rotation and the ACB phase rotation when a phase angle of the first phase is between 240° and 300°, a phase angle of a second phase is between 120° and 180°, and a phase angle of a third phase is between 0° and 60°.

13. The one or more tangible, non-transitory, computer-readable media of claim 11, comprising instructions that, when executed by the processor, cause the processor to determine that a second phase is open with respect to the ABC phase rotation and the ACB phase rotation when a phase angle of a first phase is between 120° and 180°, a phase angle of the second phase is between 0° and 60°, and a phase angle of a third phase is between 240° and 300°.

14. The one or more tangible, non-transitory, computer-readable media of claim 11, comprising instructions that, when executed by the processor, cause the processor to determine a third phase is open with respect to the ABC phase rotation and the ACB phase rotation when a phase angle of a first phase is between 0° and 60°, a phase angle of a second phase is between 240° and 300°, and a phase angle of a third phase is between 120° and 180°.

15. The one or more tangible, non-transitory, computer-readable media of claim 11, comprising instructions that, when executed by the processor, cause the processor to determine a first phase and a second phase are open with respect to the ABC phase rotation when a phase angle of the first phase is between 180° and 240°, a phase angle of the second phase is between 60° and 120°, and a phase angle of a third phase is between 300° and 360°.

16. The one or more tangible, non-transitory, computer-readable media of claim 11, comprising instructions that, when executed by the processor, cause the processor to determine that a first phase and a third phase are open with respect to the ABC phase rotation when a phase angle of the first phase is between 300° and 360°, a phase angle of a second phase is between 180° and 240°, and a phase angle of the third phase is between 60° and 120°.

17. The one or more tangible, non-transitory, computer-readable media of claim 11, comprising instructions that, when executed by the processor, cause the processor to determine that a second phase and a third phase are open with respect to the ABC phase rotation when a phase angle of a first phase is between 60° and 120°, a phase angle of the second phase is between 300° and 360°, and a phase angle of the third phase is between 180° and 240°.

18. An intelligent electronic device, comprising:
   processing circuitry;
   a communication system; and
   a memory device comprising instructions that cause the processing circuitry to:
      calculate a power phasor for each phase of a multi-phase capacitor bank system with respect to an ABC phase rotation, an ACB phase rotation, or both, wherein the power phasor comprises a vector product of a voltage received from a respective combo sensor at each phase of one or more phases of the multi-phase capacitor bank system and a fundamental frequency of a neutral current received from a neutral current sensor;
      in response to each magnitude of each power phasor being greater than a threshold value:
         determine which of the one or more phases are open based on each phase angle of each power phasor; and
         issue a notification indicating the one or more phases that are open.

19. The intelligent electronic device of claim 18, wherein the threshold value is configurable based at least in part on a nominal voltage and expected capacitor bank size of the multi-phase capacitor bank system.

20. The intelligent electronic device of claim 18, comprising determining a neutral current of the multi-phase capacitor bank system via a plurality of current sensors, wherein each current sensor corresponds to a phase of the multi-phase capacitor bank system, and determining that the one or more phases are open within response to determining that a magnitude of the neutral current is greater than another threshold value.

21. The intelligent electronic device of claim 18, comprising instructions that cause the processing circuitry to determine that a first phase and a second phase are open with respect to the ACB phase rotation when a phase angle of the first phase is between 300° and 360°, a phase angle of the second phase is between 60° and 120°, and a phase angle of a third phase is between 180° and 240°.

22. The intelligent electronic device of claim 18, comprising instructions that cause the processing circuitry to determine that a first phase and a third phase are open with respect to the ACB phase rotation when a phase angle of the first phase is between 180° and 240°, a phase angle of a second phase is between 300° and 360°, and a phase angle of the third phase is between 60° and 120°.

23. The intelligent electronic device of claim 18, comprising instructions that cause the processing circuitry to determine that a second phase and a third phase are open with respect to the ACB phase rotation when a phase angle of a first phase is between 60° and 120°, a phase angle of the second phase is between 180° and 240°, and a phase angle of the third phase is between 300° and 360°.

24. The intelligent electronic device of claim 18, wherein the multi-phase capacitor bank system comprises a three-phase capacitor bank system.

* * * * *